US006544034B2

(12) United States Patent
Watanabe

(10) Patent No.: US 6,544,034 B2
(45) Date of Patent: Apr. 8, 2003

(54) HEAT TREATMENT EQUIPMENT FOR OBJECT TO BE TREATED AND ITS EXHAUSTING METHOD

(75) Inventor: Minoru Watanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/938,318

(22) Filed: Aug. 24, 2001

(65) Prior Publication Data

US 2002/0127509 A1 Sep. 12, 2002

(30) Foreign Application Priority Data

Mar. 12, 2001  (JP) ........................... 2001-068846

(51) Int. Cl.$^7$ ................................. F27B 5/16
(52) U.S. Cl. ........................ 432/200; 432/152
(58) Field of Search ...................... 432/200, 152, 432/5, 6, 11, 241; 219/390; 118/724, 725

(56) References Cited

U.S. PATENT DOCUMENTS 5,254,367 A  * 10/1993  Matsumura et al. ........ 427/240
5,902,103 A  *  5/1999  Maeda et al. .............. 432/152

* cited by examiner

Primary Examiner—Jiping Lu
(74) Attorney, Agent, or Firm—Rabin & Berdo, P.C.

(57) ABSTRACT

This invention provides a heat treatment equipment for an object to be treated capable of removing the desorption gas effectively, and of ensuring the equality of the temperature in the plane of the object to be treated by controlling preferably the turbulent airflow inside the heat treatment chamber. More specifically, this invention provides a heat treatment equipment for an object to be treated comprising a heat treatment chamber 104 having an opening and closing shutter 110 for carrying the object to be treated on the side thereof, an exhaust air way 113 formed along the periphery of the heat treatment chamber 104 including the opening and closing shutter 110 and an exhaust hole 101 for exhausting in the heat treatment chamber 104 from the exhaust air way 113 through the opening and closing shutter 110.

14 Claims, 10 Drawing Sheets

HEAT TREATMENT EQUIPMENT FOR OBJECT TO BE TREATED AND ITS EXHAUSTING METHOD

BACKGROUND OF THE INVENTION

1. Field of the Invention

The present invention relates to heat treatment equipment for an object to be treated and the method of outputting the treatment's exhaust gas. More specifically, the present invention relates to heat treatment equipment for an object to be treated and the method of outputting the exhaust gas resulting from the heat treatment, through exhaust holes in the equipment's heat treatment chamber.

2. Prior Art

Recently, the demand for a device to be technically advanced and to be highly integrated is increasing. For this reason, the technique is remarkably developing that a pattern becomes minute and that the diameter of a semiconductor wafer becomes larger than it was. However, the minute pattern and the large diameter of the semiconductor wafer have made it difficult to ensure the equality of each size of the minute element pattern in the plane of the large diameter of the semiconductor wafer. This size accuracy is highly related to the reliability and yield of a semiconductor device. For example, a resist coating step in a photolithography step and various baking process as in a development step are given as one of the factors influencing the size accuracy of the element pattern. Especially, a chemical amplification resist is used as a resist material in a KrF excimer lithography step generally adopted to a mass production process for producing a pattern with a size of less than a quarter micrometer. The chemical amplification resist is an important parameter to decide the size by, especially, a baking condition.

Consequently, in the baking process in the process wherein the chemical amplification resist is used, it is necessary to keep the temperature distribution constant to ensure the size accuracy of the pattern in the plane of the large diameter of the semiconductor wafer. Therefore, it is also necessary for a heater inside a hot plate chamber to keep the temperature of the semiconductor wafer in the surface of the plane constant to control strictly the airflow inside the hot plate chamber.

Further recently, such various resist shrink techniques as the thermal shrink method are increasingly developed. However, it is necessary to control the baking temperature more strictly to introduce this kind of technique into an actual production line.

For example, a resist coating apparatus includes such plural units as a hot plate unit, a cooling unit and a coating unit. And a development apparatus includes such plural units as a hot plate unit, a cooling unit and a development unit.

Hereinafter, a schematic view of a conventional heat treatment equipment for an object to be treated is described with reference to FIGS. 9 and 10. It is to be noted that FIG. 9 is a sectional view showing the configuration of the conventional heat treatment equipment for an object to be treated and that FIG. 10 is a top view showing the configuration of the conventional heat treatment equipment for an object to be treated.

As shown in FIGS. 9 and 10, the conventional heat treatment equipment for an object to be treated has a heat treatment chamber (for example, a hot plate chamber) 604 for heating a semiconductor wafer (an object to be treated) 609. An up-and-down-movable support pin 606 carrying and mounting the semiconductor wafer 609 is set on a susceptor 605 set at the bottom of the heat treatment chamber 604. Also, a heater 607 heating the semiconductor wafer 609 for the baking process is set under the semiconductor wafer 609.

In addition, an opening and closing shutter 610 for opening and closing to carry the semiconductor wafer 609 into the heat treatment chamber 604 is set at the side of the heat treatment chamber 604. Further, an exhaust hole 601 is set on the upper part of the heat treatment chamber 604, and exhausted air 602 is released outside through a manual damper 612.

Next, a conventional heating treatment method for the object to be treated by the conventional heat treatment equipment for an object to be treated is to be described.

In the heating treatment (for example, a baking process) inside each treatment chamber (for example, a hot plate chamber), the opening and closing shutter 610 in the heat treatment chamber is opened, and a carrying robot, for example, transfers the semiconductor wafer 609 to the treatment chamber 604. At this time, the support pins 606 are waiting at an elevating location, and the carried semiconductor wafer 609 is placed on the support pins 606.

In the next process, the support pins 606 are sent down to place on a predetermined location for the heat treatment (for example, a baking process) for the semiconductor wafer 609. After that, the opening and closing shutter 610 is closed to achieve the baking process by heating the heater 607, and exhausting gas through an exhaust hole 601 set on the upper part of the heat treatment chamber 604.

However, when the exhaust hole is set on the upper part of the heat treatment chamber (on the upper side of the semiconductor wafer) as in the conventional heat treatment equipment (the hot plate apparatus), the airflow inside the heat treatment chamber is changed due to the differences of the location and diameter of the exhaust hole to make it difficult to keep the temperature distribution on the semiconductor wafer constant inside. For this reason, it becomes difficult to control the temperature accuracy in the plane of the semiconductor wafer strictly. Especially, the higher the exhaust pressure in the baking process becomes, the more deteriorated the equality of the temperature in the plane of the semiconductor wafer becomes.

Consequently, it is an important factor to control the airflow inside the hot plate to enhance the temperature accuracy inside the hot plate. However, since the preferable exhaust cannot be executed inside various baking furnaces and the turbulent airflow inside the furnace occurs, the equality of the temperature in the plane of the semiconductor wafer becomes deteriorated.

At this time, when the exhaust pressure is reduced to save the turbulent airflow inside the heat treatment chamber, the intended purpose of exhaust cannot be achieved because such a desorption element from the resist as a solvent and a monomer is not removed enough. For this reason, a desorption gas diffuses into the peripheral units to pollute the inside of each apparatus such as the resist coating apparatus, the development apparatus and a photolithography apparatus for the semiconductor wafer. This may cause pollution inside the clean room by the heat treatment equipment itself.

Therefore, an object of the present invention is to provide novel and improved heat treatment equipment for an object to be treated capable of removing the desorption gas effectively, and of ensuring the equality of the temperature in the plane of the object to be treated by controlling preferably the turbulent airflow inside the heat treatment chamber.

SUMMARY OF THE INVENTION

To achieve the above object in the present typical invention, there is provided heat treatment equipment (a heat treatment apparatus for an object to be treated comprising a heat treatment chamber having an opening and closing shutter for carrying the object to be treated, an exhaust airway formed along the periphery of the heat treatment chamber and conducting the exhausted air of the heat treatment chamber to an exhaust hole through the opening and closing shutter and an exhaust hole for releasing the exhausted air conducted from the exhaust airway outside the heat treatment chamber.

In the present invention as described above, the exhaust is achieved not by a direct exhaust from the heat treatment chamber but by an exhaust from the outside the heat treatment chamber through the opening and closing shutter during the baking process for the object to be treated (for example, a semiconductor wafer) in the heat treatment chamber (for example, a hot plate chamber). Therefore, in the heat treatment chamber, the turbulent airflow due to the exhaust does not occur which enhances the equality of the temperature in the plane of the object to be treated, and as a result, enhances the size accuracy of the element pattern. In addition, since the exhaust in the heat treatment chamber is under execution, the desorption gas of the object to be treated does not diffuse into the peripheral equipments and the like.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 1:
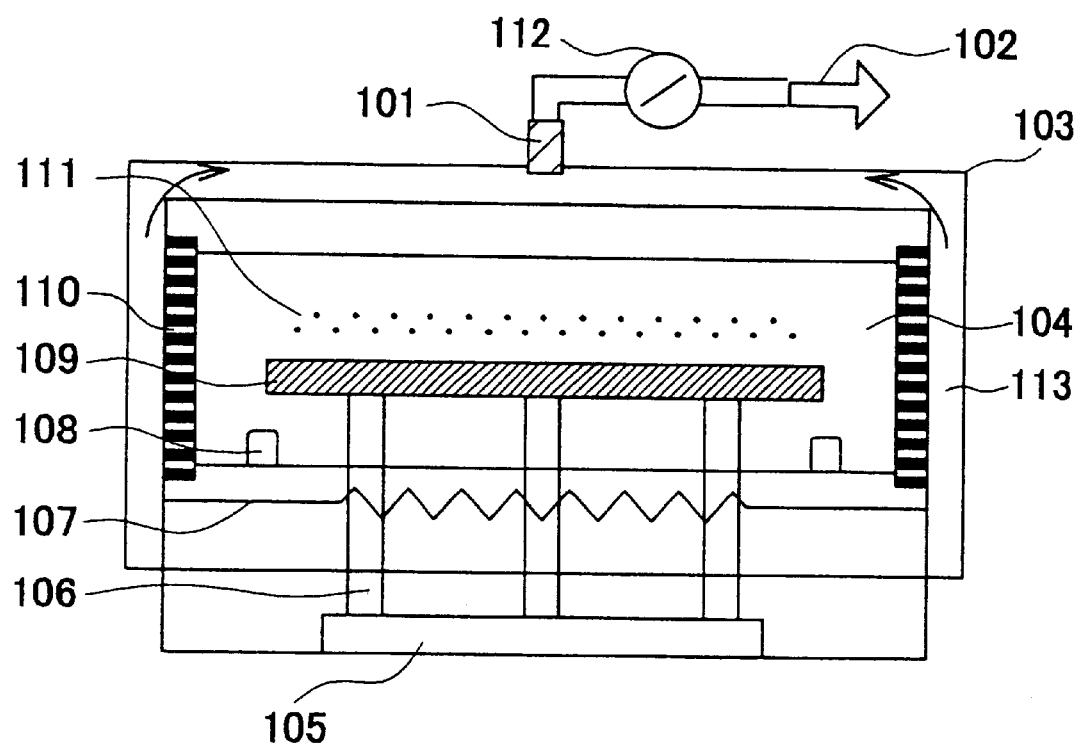
FIG. 1 is a sectional view showing the configuration of the heat treatment equipment for an object to be treated in a first embodiment.

Hereinafter, the preferred embodiment of a heat treatment apparatus of the present invention will be described with reference to the accompanying drawings. Same reference numerals are attached to components having same functions in the following description and the accompanying drawings, and a description thereof is omitted.

First Embodiment

First, heat treatment equipment (a heat treatment apparatus) in a first embodiment is described with reference to FIGS. 1 and 2. It is to be noted that FIG. 1 is a sectional view showing the configuration of the heat treatment equipment for an object to be treated in the first embodiment and that FIG. 2 is a top view showing the configuration of the heat treatment equipment for an object to be treated in the first embodiment.

Figure 2:
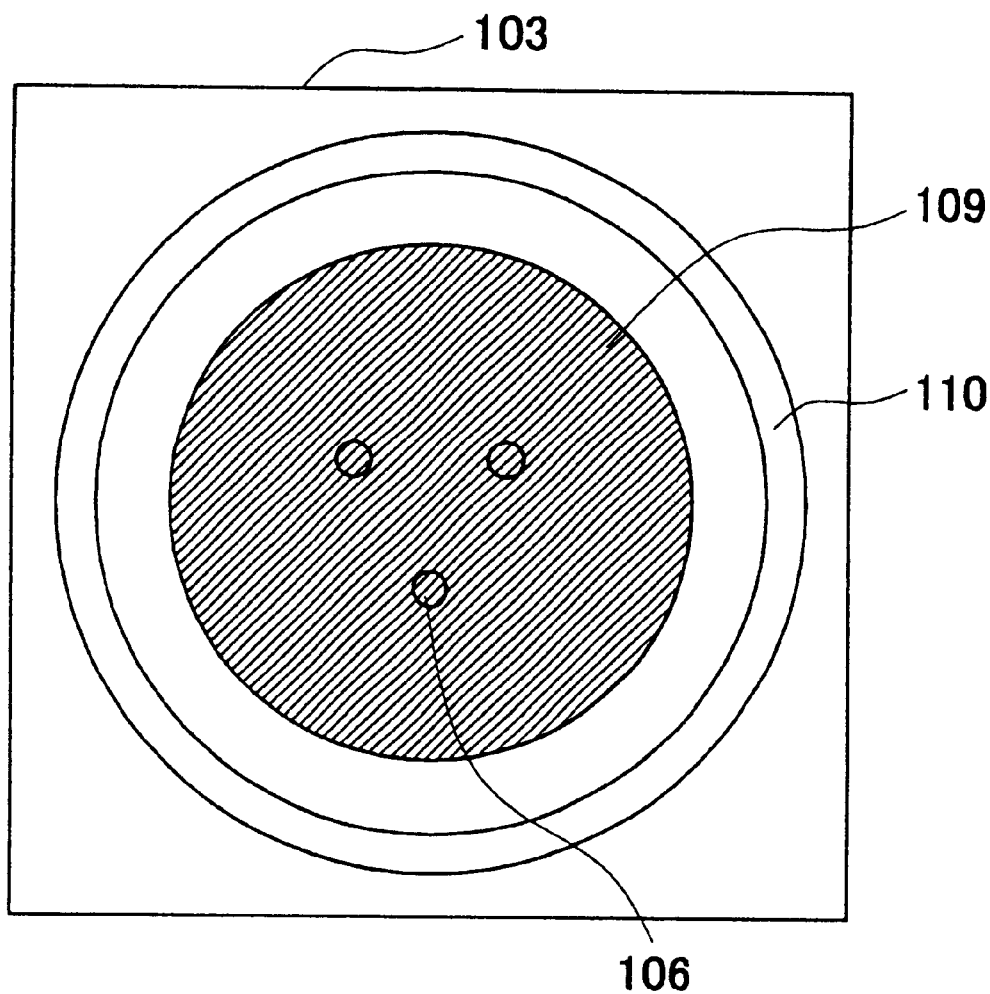
FIG. 2 is a top view showing the configuration of the heat treatment equipment for an object to be treated in the first embodiment.

As shown in FIGS. 1 and 2, the heat treatment equipment for an object to be treated in this embodiment has a heat treatment chamber 104 for heating an object to be treated (for example, a semiconductor wafer) 109. An opening and closing shutter 110 opening and closing to carry the semiconductor wafer 109 into the heat treatment chamber 104 is set at the side of the heat treatment chamber 104. Up-and-down-movable support pins 106 carrying and mounting the semiconductor wafer 109 is set on a susceptor 105 set at the bottom of the heat treatment chamber 104. Also, a heater 107 heating the semiconductor wafer 109 for the baking process is set under the semiconductor wafer 109.

The periphery of the heat treatment chamber 104 including the opening and closing shutter 110 is covered with a unitary steel case 103, and an exhaust airway 113 is set between the heat treatment chamber 104 and the unit steel case 103. In addition, an exhaust hole 101 is formed on an exhaust airway 113 on the upper part of the heat treatment chamber 104, and exhausted air 102 is released outside through a manual damper 112.

In this embodiment, differently from the conventional one, since the exhaust hole for exhausting directly from the heat treatment chamber 104 is not set, the exhaust is achieved by an exhaust from the exhaust hole 101 set at the outside the heat treatment chamber 104 through the opening and closing shutter 110. Therefore, in the heat treatment chamber 104, the turbulent airflow due to the exhaust does not occur thereby to enhance the equality of the temperature in the plane of an object 109 to be treated, and as a result, also to enhance the size accuracy of the element pattern. In addition, since the exhaust in the heat treatment chamber 104 is under execution, the desorption gas of the object 109 to be treated does not diffuse into the peripheral equipments and the like.

Next, a heating treatment method for the object to be treated by the heat treatment equipment for the object to be treated is to be described.

First, the opening and closing shutter 110 in the heat treatment chamber (for example, a hot plate chamber) 104 is released, and a carrying robot, for example, transfers the semiconductor wafer 109 to the treatment chamber 104. At this time, the support pin 106 is waiting at an elevating location, and the carried object to be treated (for example, a semiconductor wafer) 109 is placed on the support pin 106.

In the next process, the support pin 106 is sent down to place on a predetermined location for the heat treatment (for example, a baking process) for the semiconductor wafer 109. After that, the opening and closing shutter 110 is closed to achieve the baking process by heating the semiconductor wafer 109 with the heater 107, exhausting through an exhaust hole 101 set at the exhaust airway 113 along the periphery of the heat treatment chamber 104. During this process, the exhaust in the heat treatment chamber 104 is indirectly achieved through the openings on the shutter.

In the equipment of this embodiment, differently from the conventional one, the exhaust is achieved not from inside the heat treatment chamber 104, but from the exhaust airway 113 set along the periphery of the opening and closing shutter 110 during the baking process for the semiconductor wafer.

After the baking process for the semiconductor wafer 109 ends, the opening and closing shutter 110 is opened to carry the semiconductor wafer 109 to the next process unit.

In this embodiment, the exhaust is achieved not by a direct-exhaust from the heat treatment chamber but by an exhaust from the outside the heat treatment chamber through the opening and closing shutter during the baking process for the object to be treated (for example, a semiconductor wafer) in the heat treatment chamber (for example, a hot plate chamber). Therefore, in the heat treatment chamber, the turbulent airflow due to the exhaust does not occur to enhance the equality of the temperature in the plane of the object to be treated, as a result, to enhance the size accuracy of the element pattern. In addition, since the exhaust in the heat treatment chamber is under execution, the desorption gas of the object to be treated does not diffuse into the peripheral equipments and the like.

Second Embodiment

In the conventional heat treatment equipment, plural heat treatment chambers are set, and in the equipment in the first embodiment as described above, it is necessary to set each exhaust hole on each heat treatment chamber respectively. In the equipment in this embodiment, however, the exhaust from more than two heat treatment chambers can be achieved by a single exhaust hole.

Hereinafter, a heat treatment equipment in the second embodiment is described with reference to FIG. 3. It is to be noted that FIG. 3 is a sectional view showing the configuration of the heat treatment equipment for an object to be treated in the second embodiment.

Figure 3:
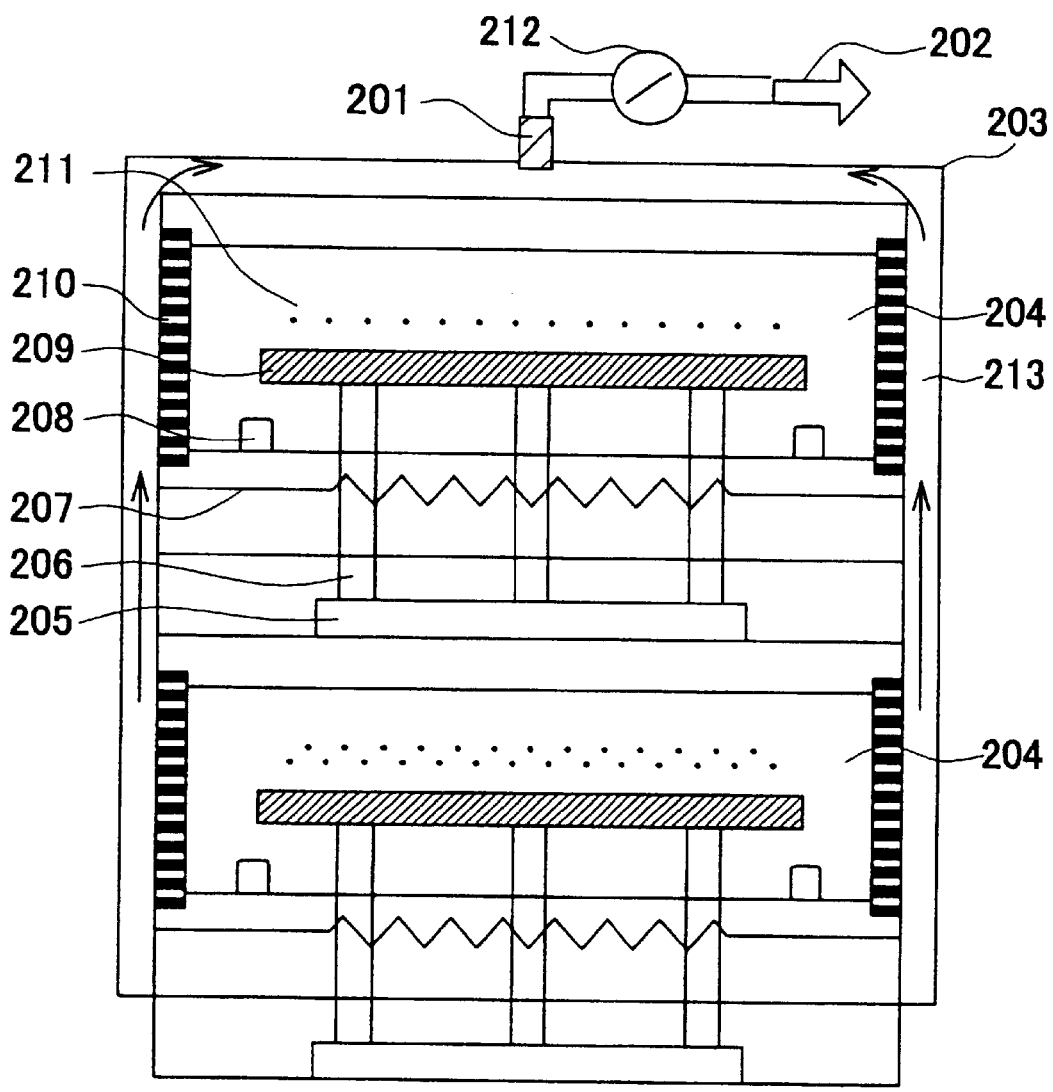
FIG. 3 is a sectional view showing the configuration of the heat treatment equipment for an object to be treated in a second embodiment.

In the heat treatment equipment in this embodiment as shown in FIG. 3, differently from that in the first embodiment, plural heat treatment chambers 204 for heating the semiconductor wafer 209 are set.

An opening and closing shutter 210 opening and closing to carry an object to be treated (for example, the semiconductor wafer) 209 into the heat treatment chambers 204 are set at the side of each heat treatment chamber 204. An up-and-down-movable support pin 206 carrying and mounting the semiconductor wafer 209 is set on a susceptor 205 set at the bottom of the heat treatment chamber 204. Also, a heater 207 heating the semiconductor wafer 209 for the baking process is set under the semiconductor wafer 209.

The periphery of the plural heat treatment chambers 204 including all the opening and closing shutters 210 is covered with an unit steel case 203, and an exhaust airway 213 is set between each heat treatment chamber 204 and the unit steel case 203. During this process, the exhaust in the heat treatment chamber 204 is indirectly achieved through the openings on the opening and closing shutter 210. In addition, an exhaust hole 201 is formed on an exhaust airway 213 on the uppermost part of the heat treatment chamber 204, and exhausted air 202 is released outside through a manual damper 212.

In this embodiment, plural heat treatment chambers form as one unit, between which and an outer wall (unit steel case) 203 covering to insulate with other units the exhaust airway 213 is formed. And the exhaust is achieved through an exhaust hole 201 set on the exhaust airway 213.

Further in this embodiment, since the exhaust system is simplified even in the heat treatment equipment having plural heat treatment chambers (hot plate chambers), there can be provided a heat treatment equipment of maintenance-facilitated at low cost. Also, the exhaust is achieved not by a direct exhaust from the heat treatment chamber but by an exhaust from the outside the heat treatment chamber through each opening and closing shutter during the baking process for the object to be treated (for example, a semiconductor wafer) in the heat treatment chamber (for example, a hot plate chamber). Therefore, in the heat treatment chamber, the turbulent airflow due to the exhaust does not occur to enhance the equality of the temperature in the plane of the object to be treated, as a result, to enhance the size accuracy of the element pattern. In addition, since the exhaust in the heat treatment chamber is under execution, the desorption gas of the object to be treated does not diffuse into the peripheral equipments and the like.

Third Embodiment

In the conventional heat treatment equipment, since the value of the exhaust pressure is set by the manual damper to exhaust, the airflow inside the heat treatment chamber cannot be preferably adjusted. The heat treatment equipment for an object to be treated in this embodiment, the automatic damper, the exhaust pressure of which is randomly changeable by using an exhaust controller is adopted instead of the manual damper (manual adjustment exhaust valve) in the conventional equipment. The explanation otherwise, which is the same as that of the conventional equipment, is to be omitted.

Hereinafter, a heat treatment equipment in the third embodiment is described with reference to FIG. 4. It is to be noted that FIG. 4 is a sectional view showing the configuration of the heat treatment equipment for an object to be treated in the third embodiment.

Figure 4:
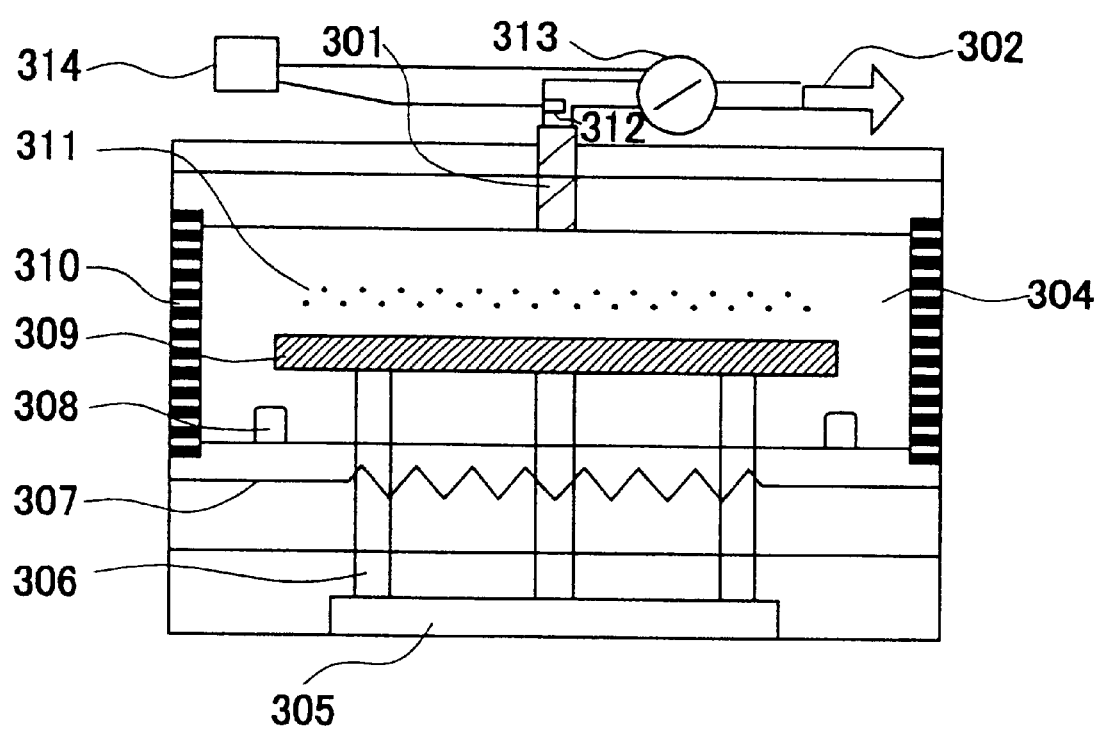
FIG. 4 is a top view showing the configuration of the heat treatment equipment for an object to be treated in the second embodiment.

First, as shown in FIG. 4, an exhaust hole 301 is set on a heat treatment chamber 304, and exhausted air 302 is released outside the treatment chamber 304 through the automatic damper (automatic adjustment exhaust valve) 313. Also, a exhaust pressure sensor 312 is set between the exhaust hole 301 and the automatic damper 313, and the detected value from the exhaust pressure sensor 312 is input to a exhaust controller 314 to adjust the opening degree of the automatic damper 313.

The exhaust controller 314 can control ON/OFF switch or set the value of exhaust pressure randomly. For example, the sequence can be executed that the exhaust is stopped or a low-pressure value is set during the heat treatment for the semiconductor wafer by the automatic damper or an air-operated valve to achieve the exhaust under high pressure during the treatment other than the heat treatment. Also, the ON/OFF switch of an exhaust line can be controlled by the controller 314.

In this embodiment, the value of the exhaust pressure can be changed or the exhaust can be stopped during the heat treatment for the object to be treated (for example, a semiconductor wafer). Therefore, the sequence can be executed that the exhaust pressure is lowered during the heat treatment for the object to be treated (for example, a semiconductor wafer) to enhance the temperature accuracy in the plane of the semiconductor wafer.

Fourth Embodiment

Generally, the airflow inside the heat treatment chamber caused by the exhaust depends on an exhaust pressure, baking temperature, the location of an exhaust hole, the size of the exhaust hole and the like. In this embodiment, the airflow inside the heat treatment chamber can be adjusted by setting plural exhaust holes in the heat treatment chamber and by selecting some exhaust holes among the plural exhaust holes by a shield according to such a heat treatment condition as a baking process condition.

In the heat treatment equipment for an object to be treated in this embodiment, the difference from the conventional one is that plural exhaust holes are set and that some exhaust holes can be selected by the shield. The explanation otherwise, which is the same as that of the conventional equipment, is to be omitted.

Hereinafter, a heat treatment equipment in the fourth embodiment is described with reference to FIGS. 5 and 6. It is to be noted that FIG. 5 is a sectional view showing the configuration of the heat treatment equipment for an object to be treated in the fourth embodiment and that FIG. 6 is a top view showing the configuration of the heat treatment equipment for an object to be treated in the fourth embodiment.

Figure 5:
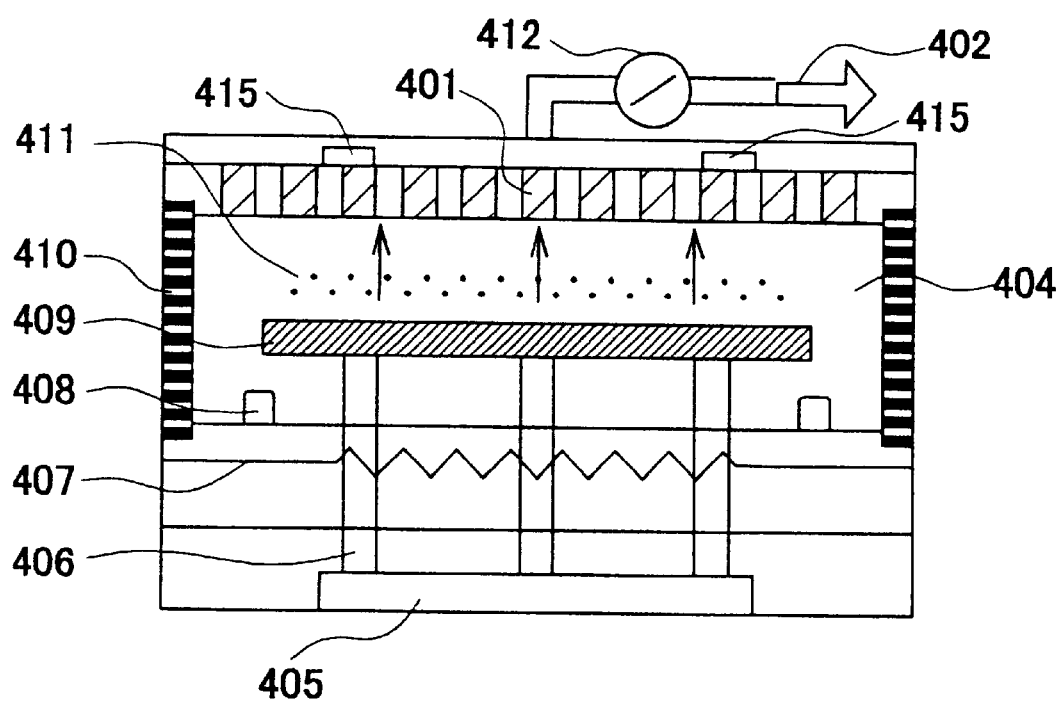
FIG. 5 is a sectional view showing the configuration of the heat treatment equipment for an object to be treated in a third embodiment.
Figure 6:
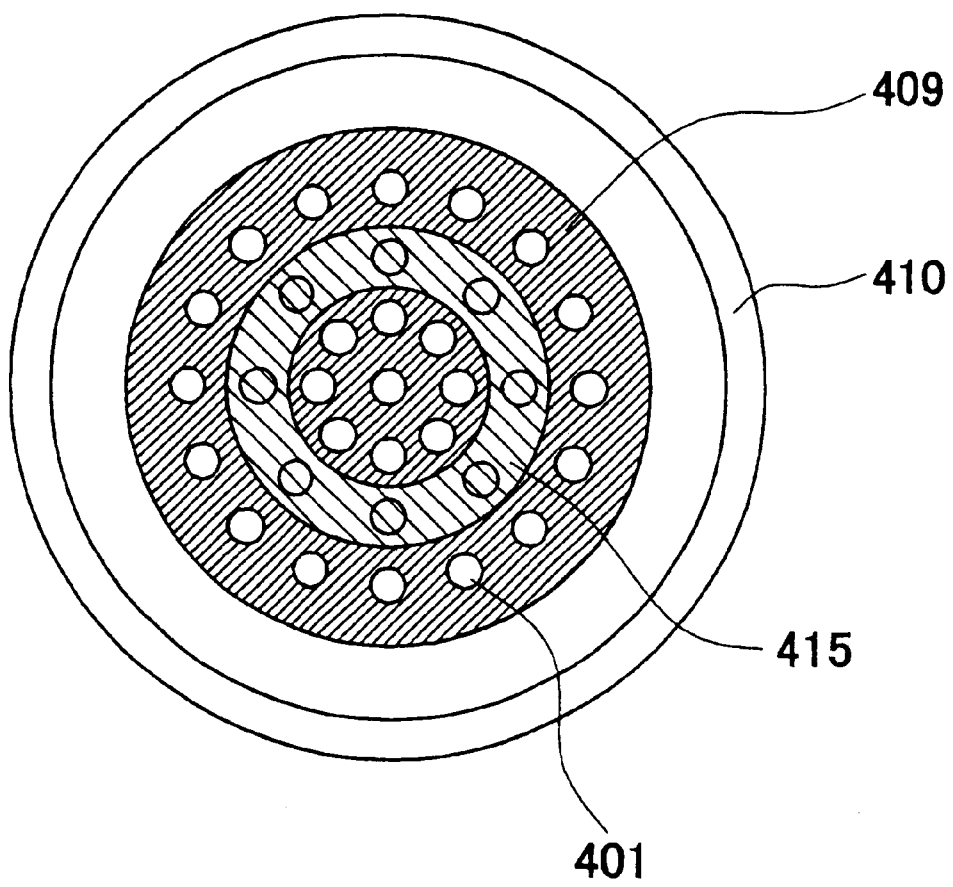
FIG. 6 is a sectional view showing the configuration of the heat treatment equipment for an object to be treated in a fourth embodiment.

First, as shown in FIGS. 5 and 6, plural exhaust holes 401 are set on the upper part of the heat treatment chamber 404, and exhausted air 402 is released outside through a manual damper 412. Also, a shield 415 with roughly concentric circle shape, for example, is set on the exhaust holes 401, among which specific ones are shielded by the shield 415 to select some of the exhaust holes 401 to exhaust.

As described above, generally, the airflow inside the heat treatment chamber (for example, a hot plate chamber) caused by the exhaust depends on an exhaust pressure, baking temperature, the location of an exhaust hole, the size of the exhaust hole and the like. The shape of the temperature distribution in the plane of the object to be treated (for example, a semiconductor wafer) is roughly concentric circle shape in many cases. Therefore in this embodiment, the airflow inside the heat treatment chamber can be adjusted according to a baking condition by setting plural exhaust holes and by selecting some of the exhaust holes to exhaust by using the shield with roughly concentric circle shape. As a result, the equality of the temperature in the plane of the semiconductor wafer can be enhanced.

In this embodiment as described above, the airflow inside the heat treatment chamber can be preferably adjusted by selecting some preferred exhaust holes according to the process under various conditions on heat treatment (for example, a baking condition). Hereby the temperature distribution in the plane of the object to be treated (for example, a semiconductor wafer) can be controlled with facility.

Fifth Embodiment

In fourth embodiment as described above, it is still difficult to adjust the airflow more finely than in the fourth embodiment wherein some of the exhaust holes to exhaust is selected by using the shield. In this embodiment, however, the finer adjustment can be achieved by adjusting each diameter of each exhaust hole by using an exhaust hole diameter adjustment apparatus, for example, an aperture and the like.

In the heat treatment equipment for an object to be treated in this embodiment, the difference from the conventional one is that plural exhaust holes are set and that each diameter of each exhaust hole is adjusted by using the exhaust hole diameter adjustment apparatus set at each exhaust hole. The explanation otherwise, which is the same as that of the conventional equipment, is to be omitted.

Hereinafter, a heat treatment equipment in the fifth embodiment is described with reference to FIGS. 7 and 8. It is to be noted that FIG. 7 is a sectional view showing the configuration of the heat treatment equipment for an object to be treated in the fifth embodiment and that FIG. 8 is a top view showing the configuration of the heat treatment equipment for an object to be treated in the fifth embodiment.

Figure 7:
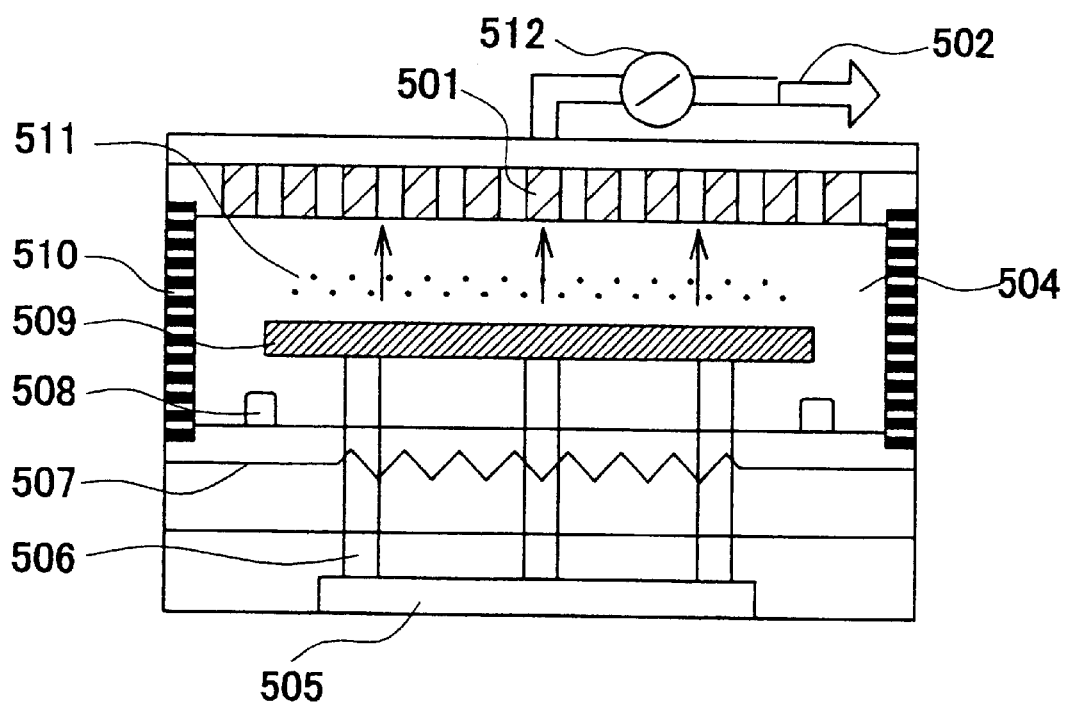
FIG. 7 is a sectional view showing the configuration of the heat treatment equipment for an object to be treated in a fifth embodiment.
Figure 8:
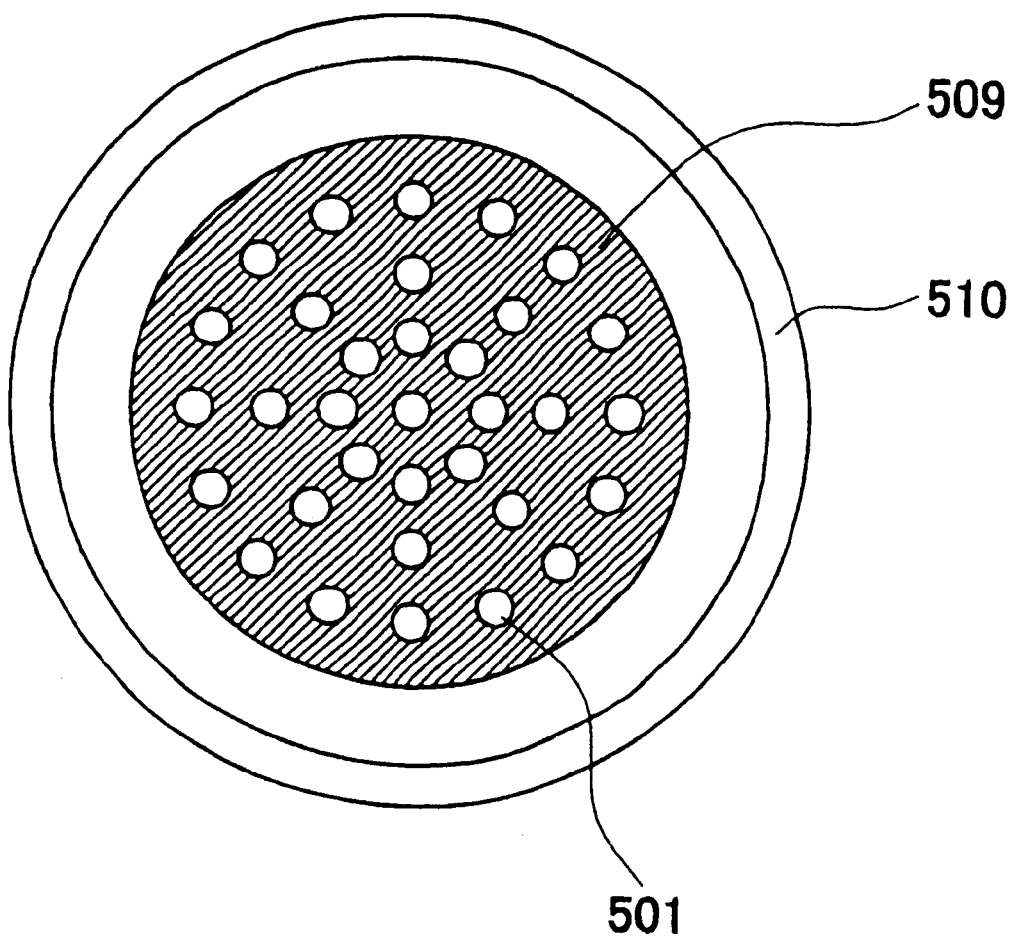
FIG. 8 is a top view showing the configuration of the heat treatment equipment for an object to be treated in the fifth embodiment.
Figure 9:
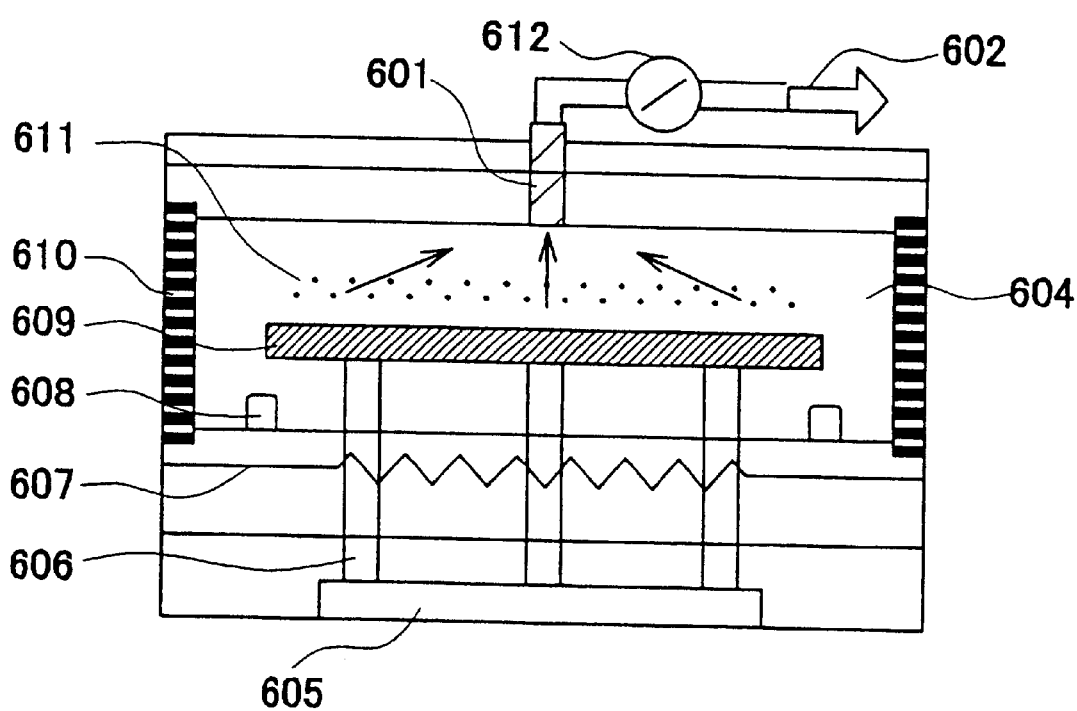
FIG. 9 is a sectional view showing the configuration of the conventional heat treatment equipment for an object to be treated.
Figure 10:
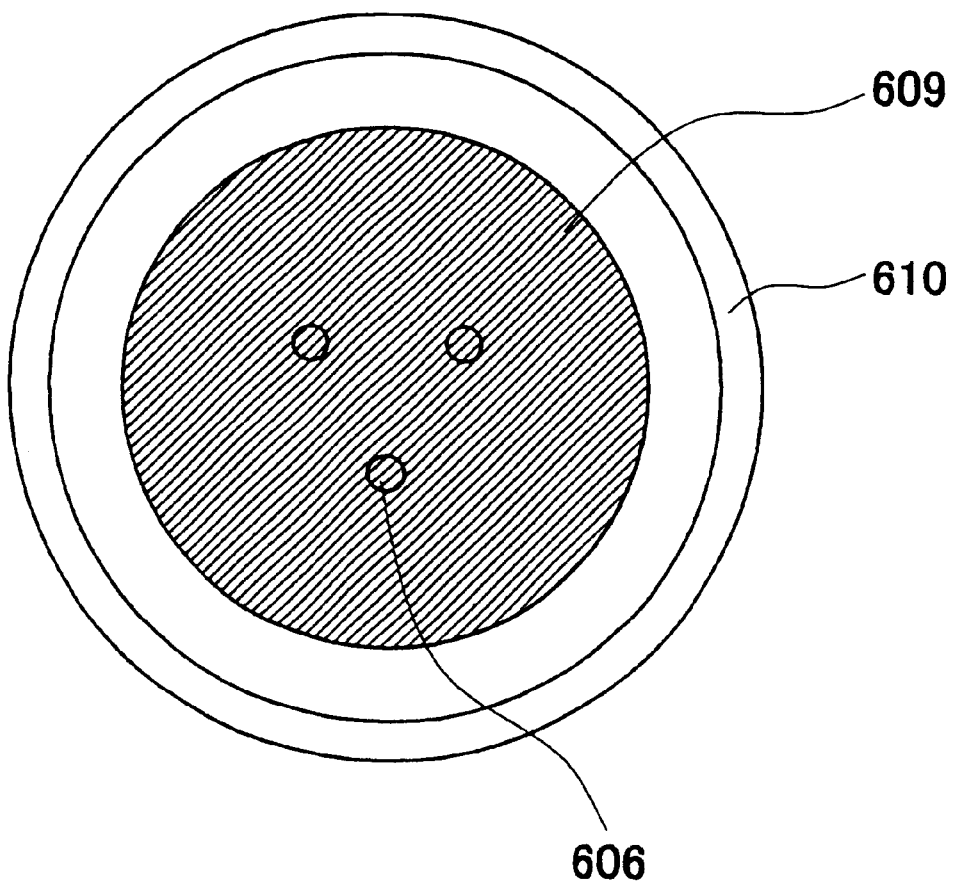
FIG. 10 is a top view showing the configuration of the conventional heat treatment equipment for an object to be treated.

First, as shown in FIGS. 7 and 8, plural exhaust holes 501 are set on the upper part of the heat treatment chamber 504, and exhausted air 502 is released outside through a manual damper 512. Also, specific exhaust hole diameter adjustment apparatuses are respectively set at each exhaust hole 502 so that each diameter can be desirably adjusted according to such a heat treatment condition as a baking condition.

It is to be noted that the exhaust hole diameter adjustment apparatus can be configured as the one focusing on roughly concentric circle shape, for example, an aperture of a camera, and as the one like a sliding door.

In this embodiment, the airflow inside the heat treatment chamber can be more finely adjusted by changing preferably the diameter of the exhaust hole according to the process under various conditions on heat treatment (for example, a baking condition). Hereby the temperature distribution in the plane of the object to be treated (for example, a semiconductor wafer) can be controlled with more facility.

Although the preferred embodiment of the present invention has been described referring to the accompanying drawings, the present invention is not restricted to such examples. It is evident to those skilled in the art that the present invention may be modified or changed within a technical philosophy thereof and it is understood that naturally these belong to the technical philosophy of the present invention.

For example, the heat treatment equipment in the embodiments as described above has been described by referring an example of a hot plate used in a lithography process in the manufacture of a semiconductor device, which is not restricted to this example. The embodiments can be achieved as the method for enhancing the temperature accuracy in heat treatment equipments in any industrial fields.

Also, the heat treatment equipment in the fourth embodiment as described above has been described by referring an example of the configuration with a shield with roughly concentric circle shape. However, shields with any shapes can be adopted.

Further, the heat treatment equipment in the fourth embodiment as described above has been described by referring an example of the configuration with some preferable exhaust holes selected by using a shield. However, the preferable exhaust can be achieved without using the shield by adjusting and arranging preferably the sizes and locations of the exhaust holes.

Still further in the embodiments as described above, the method for controlling the airflow inside the heat treatment chamber has been described in terms of the location of the exhaust hole inside the heat treatment chamber, the arrangement and selection of some preferable exhaust holes, the adoption of the automatic damper, and the like. In the heat treatment equipment in each embodiment and the conventional heat treatment equipment, however, the airflow inside the heat treatment equipment can be controlled with facility by exhausting in the heat treatment chamber not during the heat treatment for the object to be treated but before and after the heat treatment for the object to be treated.

In the heat treatment chamber, the turbulent airflow due to the exhaust does not occur to enhance the equality of the temperature in the plane of the object to be treated, as a result, to enhance the size accuracy of the element pattern. In addition, since the exhaust in the heat treatment chamber is under execution, the desorption gas of the object to be treated does not diffuse into the peripheral equipments and the like.

What is claimed is:

1. A heat treatment apparatus for an object to be treated, comprising:
   a heat treatment chamber having on a side thereof an opening and closing shutter for carrying the object to be treated;
   an exhaust airway formed along the periphery of the heat treatment chamber and conducting therethough air exhausted from the heat treatment chamber through the opening and closing shutter; and
   an exhaust hole for releasing the exhausted air conducted through the exhaust airway, from the exhaust airway to the exterior of the apparatus.

2. A heat treatment apparatus for an object to be treated wherein plural heat treatment chambers, each having an opening and closing shutter on the side thereof for carrying the object to be treated, are mounted over and under, the heat treatment apparatus for an object to be treated comprising:
   an exhaust airway formed along the periphery of the mounted plural heat treatment chambers and conducting away to a discharge location air exhausted from the heat treatment chambers through each opening and closing shutter; and
   an exhaust hole at the discharge location for releasing the exhausted air conducted from the exhaust airway outside the plural heat treatment chambers.

3. A heat treatment apparatus according to claim 1, further comprising means for adjusting exhaust pressure inside the heat treatment chamber automatically according to a predetermined or pre-programmed exhaust pressure value.

4. A heat treatment apparatus for an object to be treated, comprising:
   a heat treatment chamber having an opening and closing shutter for carrying the object to be treated into and from the chamber;
   an exhaust airway formed along the periphery of the chamber, the shutter having means for exhausting air from the chamber, the exhaust airway conducting the exhausted air away from the shutter; and
   an exhausted air releasing means for releasing the exhausted air from the exhaust airway to the exterior of the apparatus.

5. A heat treatment apparatus for an object to be treated, comprising:
   plural respective heat treatment chambers mounted on top of one another, each chamber having on a side thereof a respective opening and closing shutter for carrying the object to be treated into and from the chamber;
   a single exhausted air releasing means; and
   an exhaust airway formed along the periphery of the mounted chambers, each respective shutter having means for exhausting air from the chamber, the exhaust airway conducting the exhausted air away from the respective shutter to the single exhausted air releasing means, the single exhausted air releasing means releasing the exhausted air from the exhaust airway to the exterior of the apparatus.

6. An exhausting method for a heat treatment apparatus with a heat treatment chamber having an opening and closing shutter for carrying the object to be treated, comprising the steps of:
   conducting exhaust through the opening and closing shutter from the heat treatment chamber to an exhaust airway formed along the periphery of the heat treatment chamber; and
   conducting the exhausted air in the exhausted airway to an exhaust hole set at a predetermined place of the exhaust airway for release to the exterior of the apparatus.

7. An exhausting method for a heat treatment apparatus that includes heat treatment chambers that are mounted upon each other, each having a respective opening and closing shutter for carrying an object to be treated into the chamber, comprising the steps of:
   conducting exhaust from the heat treatment chambers to a single exhaust airway formed along the periphery of the mounted plural heat treatment chambers through the respective opening and closing shutters; and
   conducting the exhausted air in the single exhaust airway to an exhaust hole located outside the plural heat treatment chambers, for release to the exterior of the apparatus.

8. An exhausting method according to claim 6, further comprising the step of adjusting an exhaust pressure inside the heat treatment chamber automatically according to a predetermined or pre-programmed exhaust pressure value.

9. An exhausting method for a heat treatment apparatus with a heat treatment chamber having an opening and closing shutter for carrying the object to be treated into and from the chamber, comprising the steps of:
   exhausting air from the heat treatment chamber through the shutter to an exhaust airway formed along the periphery of the heat treatment chamber;
   conducting the exhausted air through the airway to an exhaust hole set at a predetermined location in the exhaust airway; and
   releasing the conducted air from the airway through the exhaust hole to the exterior of the apparatus.

10. An exhausting method according to claim 9, further comprising the step of adjusting the exhaust pressure inside the heat treatment chamber automatically according to a predetermined or pre-programmed exhaust pressure value.

11. An exhausting method for a heat treatment apparatus having plural heat treatment chambers on top of each other, each having an opening and closing shutter on a side thereof for carrying the object to be treated into and from the chamber, the method comprising the steps of:
   exhausting air from the heat treatment chambers through the shutters to an exhaust airway formed along the periphery of the heat treatment chambers;
   conducting the air exhausted from each of the chambers through the airway to a single exhaust hole set at a predetermined location in the exhaust airway; and
   releasing the conducted air from the single exhaust hole to outside the apparatus.

12. An exhausting method for a heat treatment apparatus having a heat treatment chamber having an opening and closing shutter on a side thereof, comprising the steps of:

opening the shutter and carrying an object to be heat treated into the chamber;

closing the shutter and heat treating the object in the chamber;

exhausting air from the chamber through the shutter to an exhaust airway formed along the periphery of the heat treatment chamber;

conducting the exhausted air through the airway to an exhaust hole set at a predetermined location in the exhaust airway;

releasing the conducted air from the airway through the exhaust hole to the exterior of the apparatus; and upon completion of the heat treatment, opening the shutter and removing the treated object from the apparatus.

13. An exhausting method according to claim 12, further comprising the step of adjusting the exhaust pressure inside the heat treatment chamber automatically according to a predetermined or pre-programmed exhaust pressure value.

14. An exhausting method for a heat treatment apparatus having plural heat treatment chambers on top of each other, each having an opening and closing shutter on a side thereof, the method comprising the steps of:

opening the shutters and carrying objects to be heat treated into the chambers;

closing the shutters and heat treating the objects in the chambers;

exhausting air from the heat treatment chambers through the shutters to an exhaust airway formed along the periphery of the heat treatment chambers; conducting the air exhausted from each of the chambers through the airway to a single exhaust hole set at a predetermined location in the exhaust airway;

releasing the conducted air from the single exhaust hole to outside the apparatus and upon completion of the heat treatment, opening the shutters and removing the treated objects from the apparatus.

* * * * *